(12) United States Patent
Sekiguchi et al.

(10) Patent No.: US 8,004,082 B2
(45) Date of Patent: Aug. 23, 2011

(54) ELECTRONIC COMPONENT FORMED WITH BARRIER-SEED LAYER ON BASE MATERIAL

(75) Inventors: Junnosuke Sekiguchi, Kitaibaraki (JP); Toru Imori, Kitaibaraki (JP)

(73) Assignee: Nippon Mining & Metals Co., Ltd., Minato-ku, Tokyo (JP)

( * ) Notice: Subject to any disclaimer, the term of this patent is extended or adjusted under 35 U.S.C. 154(b) by 244 days.

(21) Appl. No.: 12/449,128

(22) PCT Filed: Feb. 19, 2009

(86) PCT No.: PCT/JP2009/052916
§ 371 (c)(1),
(2), (4) Date: Jul. 23, 2009

(87) PCT Pub. No.: WO2009/116346
PCT Pub. Date: Sep. 24, 2009

(65) Prior Publication Data
US 2011/0006426 A1 Jan. 13, 2011

(30) Foreign Application Priority Data

Mar. 19, 2008 (JP) .................. 2008-070855

(51) Int. Cl.
*H01L 21/00* (2006.01)
(52) U.S. Cl. . 257/752; 257/762; 257/763; 257/E21.009; 257/E21.021; 257/E21.585; 257/E23.141; 257/E27.104; 257/E29.343
(58) Field of Classification Search .......... 257/752–763, 257/915, E21.009, E21.021, 476, 582–585, 257/23.075, 141, 27.104, 29.343
See application file for complete search history.

(56) References Cited

U.S. PATENT DOCUMENTS

| | | | | | |
|---|---|---|---|---|---|
| 4,613,404 | A | * | 9/1986 | Tabei | 216/22 |
| 4,996,116 | A | * | 2/1991 | Webster et al. | 428/627 |
| 5,292,558 | A | * | 3/1994 | Heller et al. | 438/643 |
| 5,382,817 | A | * | 1/1995 | Kashihara et al. | 257/295 |
| 5,417,821 | A | * | 5/1995 | Pyke | 205/775 |
| 5,591,321 | A | * | 1/1997 | Pyke | 205/787 |
| 5,855,995 | A | * | 1/1999 | Haq et al. | 428/210 |
| 2009/0233441 | A1 | * | 9/2009 | Leong et al. | 438/675 |
| 2010/0096756 | A1 | * | 4/2010 | Tagami et al. | 257/762 |

FOREIGN PATENT DOCUMENTS

| | | |
|---|---|---|
| JP | 2001-135721 | 5/2001 |
| JP | 2006-196642 | 7/2006 |
| JP | 2006-303062 | 11/2006 |
| JP | 2007-251164 | 9/2007 |
| JP | 2007-318141 | 12/2007 |
| JP | 2008-223100 | 9/2008 |
| WO | WO 2006/115476 | 11/2006 |
| WO | WO 2006/121604 | 11/2006 |
| WO | WO 2007/044305 | 4/2007 |
| WO | WO 2009/016979 | 2/2009 |
| WO | WO 2009/016980 | 2/2009 |

* cited by examiner

*Primary Examiner* — Michael S Lebentritt
(74) *Attorney, Agent, or Firm* — Flynn, Thiel, Boutell & Tanis, P.C.

(57) ABSTRACT

It is an object of the present invention to provide a technology for forming an ULSI fine copper wiring by a simpler method. An electronic component in which a thin alloy film of tungsten and a noble metal used as a barrier-seed layer for an ULSI fine copper wiring is formed on a base material, wherein the thin alloy film has a composition comprising tungsten at a ratio equal to or greater than 60 at. % and the noble metal at a ratio of equal to or greater than 5 at. % and equal to or less than 40 at. %. The noble metal is preferably one or more kinds of metals selected from the group consisting of platinum, gold, silver and palladium.

5 Claims, No Drawings

ELECTRONIC COMPONENT FORMED WITH BARRIER-SEED LAYER ON BASE MATERIAL

TECHNICAL FIELD

The present invention relates to an electronic component in which a barrier-seed layer for an ULSI fine copper wiring is formed on a base material.

BACKGROUND ART

A method by which a seed layer is provided by electroless copper plating and a copper film is formed by copper electroplating is known as a method for forming a copper film of an ULSI fine copper wiring (damascene copper wiring).

When electroless copper plating is performed on a mirror finished surface such as a semiconductor wafer by a conventional method, it is difficult to obtain sufficient adhesion for the deposited plated film. Furthermore, the plating reactivity is low and uniform plating is difficult to perform over the entire surface of the substrate. For example, the problems arising in a case where a copper seed layer is formed by a conventional electroless plating method on a barrier metal layer, such as tantalum nitride, are that a uniform plated layer is difficult to form and adhesive strength of the plated layer is insufficient.

The inventors of the present invention have previously discovered that the deposition rate in plating can be reduced, crystal grains can be greatly refined, and a uniform thin film with a thickness of equal to or less than 15 nm can be formed on a mirror finished surface such as a wafer by adding a water-soluble nitrogen-containing polymer with a small weight-average molecular weight (Mw) as an additive to an electroless copper plating solution, and adhering a catalytic metal to a substrate that is a material to be plated prior to immersion into the plating solution or immersing the substrate into the plating solution after a catalytic metal film has been deposited in advance on the outermost surface, so that the polymer is adsorbed via nitrogen atoms on the catalytic metal (Patent Document 1). Furthermore, in the examples of the aforementioned invention, the inventors have demonstrated that the deposition rate in plating can be reduced, crystal grains can be greatly refined, and a uniform thin film with a thickness of equal to or less than 6 nm can be formed on a mirror finished surface such as a wafer by immersing the substrate into the plating solution after the catalytic metal film has been deposited in advance on the outermost surface, and causing the adsorption of the polymer via nitrogen atoms on the catalytic metal.

Where a copper seed layer is provided by electroless plating after the catalytic metal film has been deposited in the above-descried method, that is, in the method for forming the damascene copper wiring, a barrier layer serving to prevent the diffusion of copper has to be formed in advance separately from the catalytic metal layer. Therefore, a layer consisting of two layers, that is, the barrier layer and the catalytic metal layer, is formed before the copper seed layer is formed. The resultant problem is that with the ultrafine wiring, which does not allow for a large film thickness, applications to actual processes are difficult.

The inventors have discovered that the difficulty of forming two layers prior to the formation of the copper seed layer can be resolved by forming a single layer composed of a specific thin alloy film having both the barrier capability and the catalyst capability and using a combination of substitution plating and reduction plating during electroless plating because such an approach makes it possible to form a thin and uniform copper seed layer on the produced single layer. Patent applications that cover this technology have already been filed (Patent Document 2 and Patent Document 3).

Patent Document 1: Japanese Unexamined Patent Application Publication No. 2008-223100.
Patent Document 2: International Patent Publication No. 2009/016979, Pamphlet.
Patent Document 3: International Patent Publication No. 2009/016980, Pamphlet.

DISCLOSURE OF THE INVENTION

Problems that the Invention is to Solve

However, in the above methods, in order to form an ULSI fine copper wiring (damascene copper wiring), the copper wiring also has to be formed by a copper electroplating after the steps of forming a thin alloy film having both the barrier function and the catalytic function and then forming a seed layer by electroless plating on the thin alloy film.

It is an object of the present invention to rationalize further the above-described method and provide a technology for forming an ULSI fine copper wiring by a simpler method.

Means for Solving the Problems

The results of the comprehensive study conducted by the inventors demonstrated that where a thin alloy film having a barrier function is caused to also function as a seed layer, by making the thin alloy film from tungsten, which has a barrier function, and a noble metal, it is possible to electroplate copper directly on the thin alloy film, without forming a seed layer by electroless plating or the like, and thus an ULSI fine copper wiring can be formed. This finding led to the creation of the present invention.

Thus, the present invention provides:

(1) an electronic component in which a thin alloy film of tungsten and a noble metal used as a barrier-seed layer for an ULSI fine copper wiring is formed on a base material, wherein the thin alloy film has a composition comprising tungsten at a ratio equal to or greater than 60 at. % and the noble metal at a ratio of equal to or greater than 5 at. % and equal to or less than 40 at. %;

(2) the electronic component according to (1) above, wherein the thin alloy film further includes less than 5 at. % a metal with a specific resistance value of equal to or less than 20 μΩ·cm;

(3) the electronic component according to (1) or (2) above, wherein the noble metal is one or more kinds of metals selected from the group consisting of platinum, gold, silver and palladium;

(4) the electronic component according to any one of (1) to (3) above, wherein an electroplated copper film is formed by using the thin alloy film as a barrier-seed layer to form an ULSI fine copper wiring;

(5) the electronic component according to any one of (1) to (4) above, wherein the base material is a semiconductor wafer.

Effects of the Invention

In accordance with the present invention, the thin alloy film of tungsten and a noble metal that is located on a base material demonstrates a sufficient function of a barrier and seed layer. Therefore, an ULSI fine copper wiring can be formed by performing directly copper electrodeposition, without the necessity of including a step of forming the conventional electroless plated film on the thin alloy layer. Therefore, the film thickness can be decreased, and the process can be applied to a damascene copper wiring that is being further and further refined.

BEST MODE FOR CARRYING OUT ME INVENTION

The present invention is directed to an electronic component in which a thin alloy film of tungsten and a noble metal is formed as a barrier-seed layer on a base material when an ULSI fine copper wiring is formed by copper electroplating.

Tungsten has a barrier function with respect to copper and a low specific resistance value of 5.65 $\mu\Omega\cdot cm$, but tungsten surface is easily oxidized in air. Therefore, in a case where tungsten is formed as a thin film, the surface is oxidized, resistance increases and becomes too high for serving as a seed layer for electroplating, making it impossible to obtain uniform copper electroplating. Therefore, such a tungsten thin film cannot be used. Alloying tungsten with a noble metal makes it possible to increase the resistance of tungsten surface to oxidation, improve barrier ability, decrease resistance, and perform direct electrodeposition of copper.

Examples of suitable noble metals include platinum, gold, silver and palladium. One or more kinds of metals selected from these metals can be used, but among them platinum and palladium are preferred, and palladium is particularly preferred.

The composition ratio of tungsten in the thin alloy film of tungsten and a noble metal is preferably equal to or greater than 60 at. %, and the composition ratio of the noble metal is preferably equal to or greater than 5 at. % and equal to or less than 40 at. %. Where the composition ratio of the noble metal is less than 5 at. %, the oxidation inhibition effect is small, resistance is not sufficiently decreased, and a uniform copper film is difficult to form by copper electroplating on the thin alloy film. Furthermore, where the composition ratio of the noble metal is more than 40 at. %, the noble metal can be admixed to the copper plating, and in this case the resistance of the plated copper film increases. In addition, the composition ratio of tungsten becomes too small, and the function of the layer as a barrier layer is insufficient. The more preferred composition ratio of the noble metal is equal to or greater than 10 at. % and equal to or less than 30 at. %. The preferred composition ratio of tungsten is equal to or greater than 70 at. % and equal to or less than 90 at. %.

Metals (tantalum, titanium, etc.) other than tungsten that have barrier properties either demonstrate a high resistance due to a high degree of surface oxidation or passivation of the oxide film. As a result, these metals are unsuitable for a seed layer for electroplating.

The thin alloy film may also include metals other than tungsten and the noble metal, provided that the composition ratio of these other metals is within a range in which no adverse effect is provided on barrier ability and plating ability. For example, the thin alloy film may contain less than 5 at. % a metal with a specific resistance value of equal to or less than 20 $\mu\Omega\cdot cm$. By introducing such metals, in some cases it is possible to increase resistance to electromigration.

Examples of the metal with a specific resistance value of equal to or less than 20 $\mu\Omega\cdot cm$ include aluminum (specific resistant value 2.655 $\mu\Omega\cdot cm$), magnesium (specific resistant value 4.45 $\mu\Omega\cdot cm$), tin (specific resistant value 11.0 $\mu\Omega\cdot cm$), indium (specific resistant value 8.37 $\mu\Omega\cdot cm$), molybdenum (specific resistant value 5.2 $\mu\Omega\cdot cm$), niobium (specific resistant value 12.5 $\mu\Omega\cdot cm$), zinc (specific resistant value 5.92 $\mu\Omega\cdot cm$), nickel (specific resistant value 6.84 $\mu\Omega\cdot cm$), cobalt (specific resistant value 6.24 $\mu\Omega\cdot cm$), and chromium (specific resistant value 12.9 $\mu\Omega\cdot cm$).

The thickness of the thin alloy layer is preferably equal to or less than 10 nm. Decreasing the thickness of the thin alloy film enables applications to damascene copper wiring with a wiring width at a level of several tens of nanometers.

The thin alloy film is preferably formed by sputtering that allows for easy control of the composition of the alloy film. The thin alloy film of tungsten and a noble metal can be formed by using a sputtering alloy target including tungsten and the noble metal and sputtering the target onto a base material.

The base material for forming the thin alloy film in accordance with the present invention is preferably a semiconductor wafer such as a Si wafer or a Si wafer having $SiO_2$ formed on at least part of the surface. The base material can be cleaned and wettability thereof can be improved by implementing an acid treatment, an alkali treatment, a treatment with a surfactant, an ultrasonic cleaning, or a treatment combining these methods.

In accordance with the present invention, an electronic component can be obtained by further providing an ULSI fine copper wiring on the thin alloy film by electroplating. In a case where an electroplated copper film is formed by using the thin alloy film as a barrier-seed layer, it is possible to obtain an electronic component that is free from defects such as voids and seams.

The wiring is preferably from copper or an alloy containing copper as the main component, and copper is more preferred. The electroplating copper solution is not particularly limited, provided that it has a composition that has generally been used for damascene copper wiring embedding. For example, a liquid containing, as main components, copper sulfate and sulfuric acid and, as minor components, chlorine, polyethylene glycol, bis-(3-sulfopropyl)disulfide disodium salt, Janus Green, etc. can be used. Copper electroplating can be conducted under conditions (temperature, pH, current density, and the like) similar to those of the usual copper electroplating for wiring.

EXAMPLES

Examples of the present invention will be explained below, but the present invention is not limited to these examples.

Example 1

$SiO_2$ was formed on a Si substrate, a thin alloy film with a thickness of 10 nm and a composition shown in Table 1 was produced thereon by using a sputtering alloy target consisting of a noble metal (palladium) and tungsten, and a copper wiring was formed by electroplating using the alloy film as a barrier-seed layer. The sputtering film formation was performed after generating plasma at a power of 50 W under an argon pressure of 0.8 Pa and conducting pre-sputtering for 15 minutes. The composition of electroplating solution comprised copper sulfate 0.25 mol/L, sulfuric acid 1.8 mol/L, hydrochloric acid 1.4 mmol/L, and small-amount additives [(bis-(3-sulfopropyl)disulfide disodium salt, polyethylene glycol, and Janus Green)]. The plating was conducted for 30 seconds under the following conditions: bath temperature 25° C. and current density 0.2 A/dm². Barrier ability and diffusion of the noble metal component into the plated copper layer after vacuum annealing for 30 minutes at 400° C. were examined by AES depth profile measurements. The barrier ability was determined by the existence or nonexistence of diffusion of copper into the tungsten alloy film, and the diffusion of the noble metal into the plated copper layer was determined by the existence or nonexistence of the noble metal component into the copper film. The electroplating was evaluated as follows.

Good: A copper plated film with glossy appearance was uniformly deposited over the entire surface.
Uneven deposition: A rough glossless plated film was deposited unevenly.
Impossible: No film was deposited.
The results are shown in Table 1.

Examples 2 to 7, Comparative Examples 1 to 3

Copper wirings were formed and evaluation was performed in the same manner as in Example 1, except that the composition of the thin alloy film in Example 1 was changed as shown in Table 1. The results are shown in Table 1.

TABLE 1

|  | Composition of thin alloy film | Diffusion of copper | Diffusion of noble metal | Evaluation of copper electroplating |
|---|---|---|---|---|
| Example 1 | W(70)Pd(30) | No | No | Good |
| Example 2 | W(80)Pd(20) | No | No | Good |
| Example 3 | W(70)Pt(30) | No | No | Good |
| Example 4 | W(90)Ag(10) | No | No | Good |
| Example 5 | W(70)Au(27)Al(3) | No | No | Good |
| Example 6 | W(80)Pd(18)Mg(2) | No | No | Good |
| Example 7 | W(90)Pt(9)Sn(1) | No | No | Good |
| Comparative Example 1 | W(50)Pd(50) | No | Yes | Good |
| Comparative Example 2 | W(97)Pd(3) | No | No | Uneven deposition |
| Comparative Example 3 | Ta(70)Pd(30) | No | No | Impossible |

Existence or nonexistence of copper diffusion was determined by AES depth profile measurements.
Existence or nonexistence of noble metal diffusion was determined by AES depth profile measurements.

The invention claimed is:

1. An electronic component in which a thin alloy film of tungsten and a noble metal used as a barrier-seed layer for an ULSI fine copper wiring is formed on a base material, wherein the thin alloy film has a composition comprising tungsten at a ratio equal to or greater than 60 at. % and the noble metal at a ratio of equal to or greater than 5 at. % and equal to or less than 40 at. %.

2. The electronic component according to claim 1, wherein the thin alloy film further includes less than 5 at. % a metal with a specific resistance value of equal to or less than 20 μΩ·cm.

3. The electronic component according to claim 1, wherein the noble metal is one or more kinds of metals selected from the group consisting of platinum, gold, silver and palladium.

4. The electronic component according to claim 1, wherein an electroplated copper film is formed by using the thin alloy film as a barrier-seed layer to form an ULSI fine copper wiring.

5. The electronic component according to claim 1, wherein the base material is a semiconductor wafer.

* * * * *